(12) United States Patent
Kawabata et al.

(10) Patent No.: US 7,498,668 B2
(45) Date of Patent: Mar. 3, 2009

(54) STACKED SEMICONDUCTOR DEVICE AND LOWER MODULE OF STACKED SEMICONDUCTOR DEVICE

(75) Inventors: Takeshi Kawabata, Osaka (JP); Fumito Itou, Osaka (JP)

(73) Assignee: Panasonic Corporation, Osaka (JP)

( * ) Notice: Subject to any disclaimer, the term of this patent is extended or adjusted under 35 U.S.C. 154(b) by 311 days.

(21) Appl. No.: 11/475,174

(22) Filed: Jun. 27, 2006

(65) Prior Publication Data
US 2007/0096291 A1    May 3, 2007

(30) Foreign Application Priority Data
Oct. 27, 2005   (JP) .............................. 2005-312332

(51) Int. Cl.
*H01L 23/02*   (2006.01)
(52) U.S. Cl. ...................................... 257/686; 257/777
(58) Field of Classification Search ................ 257/778, 257/686, 777, 723, 724
See application file for complete search history.

(56) References Cited

U.S. PATENT DOCUMENTS

| | | | | |
|---|---|---|---|---|
| 6,603,198 B2 * | 8/2003 | Akram et al. | ................ | 257/686 |
| 6,740,981 B2 * | 5/2004 | Hosomi | ..................... | 257/778 |
| 6,775,153 B2 * | 8/2004 | Hashimoto | ................. | 361/803 |
| 6,781,241 B2 * | 8/2004 | Nishimura et al. | ........... | 257/777 |
| 6,826,665 B1 * | 11/2004 | Nambu | ....................... | 711/162 |
| 6,858,926 B2 * | 2/2005 | Moden et al. | ................ | 257/686 |
| 7,345,361 B2 * | 3/2008 | Mallik et al. | ................ | 257/686 |
| 7,365,416 B2 * | 4/2008 | Kawabata et al. | ........... | 257/686 |
| 7,378,726 B2 * | 5/2008 | Punzalan et al. | ............ | 257/686 |
| 7,388,293 B2 * | 6/2008 | Fukase et al. | ............... | 257/774 |

FOREIGN PATENT DOCUMENTS

| | | |
|---|---|---|
| JP | 09-223725 | 8/1997 |
| JP | 2002-083897 | 3/2002 |
| JP | 2004-281633 | 10/2004 |
| JP | 2004-363126 | 12/2004 |

* cited by examiner

*Primary Examiner*—S. V Clark
(74) *Attorney, Agent, or Firm*—McDermott Will & Emery LLP

(57) ABSTRACT

A lower module of a stacked semiconductor device includes a first substrate and a first semiconductor chip held above the first substrate. The top surface of the first substrate is provided with a plurality of first chip connection terminals electrically connected to the first chip terminals, respectively, and a plurality of upper module connection terminals electrically connectable to an upper module provided with a second semiconductor chip. The back surface of the first substrate is provided with a plurality of external substrate connection terminals. Each of the first chip connection terminals is electrically connected to a corresponding one of the external substrate connection terminals, and each of the upper module connection terminals is electrically connected between a corresponding one of the chip connection terminals and a corresponding one of the external substrate connection terminals.

18 Claims, 7 Drawing Sheets

STACKED SEMICONDUCTOR DEVICE AND LOWER MODULE OF STACKED SEMICONDUCTOR DEVICE

CROSS-REFERENCE TO RELATED APPLICATIONS

This application claims priority under 35 U.S.C. § 119 on Patent Application No. 2005-312332 filed in Japan on Oct. 27, 2005, the entire contents of which are hereby incorporated by reference.

BACKGROUND OF THE INVENTION (a) Fields of the Invention

The present invention relates to stacked semiconductor devices fabricated by stacking a plurality of semiconductor devices, and to lower modules of the stacked semiconductor devices.

(b) Description of Related Art

With a demand for size reduction and functionality enhancement of electronic equipment of various types including a cellular phone and a digital camera, electronic components, in particular stacked semiconductor devices with a plurality of semiconductor devices stacked therein are being developed.

For example, a structure of the device (see, for example, Japanese Unexamined Patent Publication No. 2004-363126) is shown which is made by stacking a first semiconductor package with a first semiconductor chip held therein and a second semiconductor package with a second semiconductor chip held therein.

For such a stacked semiconductor device, inspections of the semiconductor chips stacked therein cannot be made at the time of mounting of the individual chips, and the inspections should be made after completion of stacking. If the stacked semiconductor device inspected after the stacking is judged to be defective, the device in its entirety is discarded as defective or an additional process becomes necessary in which the mounted points of the device are disconnected one by one and the disconnect chips are mounted again. This results in poor yields.

In contrast to this, another structure of the stacked semiconductor device (see, for example, Japanese Unexamined Patent Publication No. 2004-281633) is shown which is made by stacking and mounting a plurality of chips and which includes a mounting terminal for use in mounting and an inspection terminal for use in inspecting the quality thereof.

In the case of the above structure, an inspection pad of a chip having been already mounted is first joined to an inspection terminal of another chip to be stacked, and then an inspection signal is received from the inspection pad of the mounted chip to carry out an inspection. If the result of the inspection is acceptable, a mounting terminal of the inspected chip to be mounted is connected to a mounting pad of the mounted chip, thereby mounting the chips.

However, since this stacked module is constructed so that the chips are directly held on a substrate, it is difficult to use this module for the case where packages are stacked which each have a chip mounted on a sub-substrate.

Furthermore, still another structure of the stacked semiconductor device (see, for example, Japanese Unexamined Patent Publication No. 2002-83897) is shown in which inspections of electrical properties can be conducted easily.

In this semiconductor device, first and second terminals are formed which are electrically connected to a semiconductor chip. With such a structure, the first terminal can be used for an electrical connection to another component, while the second terminal can be used for inspections of electrical properties.

Moreover, a structure of a grid array type semiconductor package (see, for example, Japanese Unexamined Patent Publication No. H9-223725) is shown in which a continuity test on the joint between a signal pin and a circuit pattern of a circuit substrate after surface mounting and an electrical test on the semiconductor package after completion of fabrication can be conducted easily.

However, as reduction in size and thickness of electronic equipment and technologies for thinning semiconductor chips go forward, the need for stacking semiconductor chips to enhance the functionality of the device is increasingly intensifying. In this case, a stacked semiconductor device is required on which tests for insuring the reliability of a semiconductor device to be stacked can be conducted before the stacking. For example, tests for the continuity of a connection terminal for making connection to a semiconductor device held in an upper layer and of a protruding electrode for making connection to external equipment are needed. However, for the conventional stacked semiconductor device exemplarily shown in Japanese Unexamined Patent Publication No. 2002-83897, certain tests on the device can be conducted by using the second terminal, but a test on the device even including the connection terminal for stacking cannot be conducted.

For the conventional stacked semiconductor device shown in Japanese Unexamined Patent Publication No. H9-223725, the signal pin and a contact pad can be used to conduct a continuity test. However, a probe coming into contact with the contact pad makes scratches, which easily induces poor connection in stacking. Moreover, test equipment used is expensive.

SUMMARY OF THE INVENTION

An object of the present invention is to solve the conventional problems mentioned above and to provide a highly reliable stacked semiconductor device in which tests on the device including a connection terminal can be conducted easily.

To attain the above object, in the present invention, a lower module of a stacked semiconductor device is designed so that an upper module connection terminal for making connection to an upper module is electrically connected between a terminal of a semiconductor chip held in the lower module and a terminal for connecting the lower module to an external substrate.

To be more specific, a lower module of a semiconductor device according to the present invention is characterized by comprising: a first semiconductor chip having a plurality of first chip terminals; and a first substrate having a first chip holding surface with a larger plan size than that of the first semiconductor chip and holding the first semiconductor chip above the first chip holding surface. As a further characteristic, the first substrate includes: a plurality of first chip connection terminals provided on the first chip holding surface and electrically connected to the first chip terminals, respectively; a plurality of upper module connection terminals which are provided on a portion of the first chip holding surface located outside a region where the first semiconductor chip is held and which are electrically connectable to an upper module provided with a second semiconductor chip; and a plurality of external substrate connection terminals provided on a surface thereof opposite to the first chip holding surface. As a further characteristic, the first chip connection terminals are electrically connected to the external substrate connection terminals, respectively, and the upper module connection terminals are electrically connected between the first chip connection terminals and the associated external substrate connection terminals, respectively.

With the lower module of the stacked semiconductor device according to the present invention, the external substrate connection terminal can be used to simultaneously conduct tests of the upper module connection terminal in inspecting the functionality of the first semiconductor chip. Therefore, it is unnecessary to bring a probe into contact with the upper module connection terminal in order to conduct the continuity test of the upper module connection terminal, so that damages of the probe to the upper module connection terminal are prevented. As a result of this, the occurrence of poor connection can be suppressed to provide a highly-reliable stacked semiconductor device. Furthermore, since tests of the upper module connection terminal can be conducted simultaneously with functional tests of the first semiconductor chip, the period of time for the tests can be reduced and equipment for the tests can be simplified.

Preferably, in the lower module of the stacked semiconductor device according to the present invention, each of the external substrate connection terminals is provided with a protruding electrode capable of making connection to an external substrate.

Preferably, in the lower module of the stacked semiconductor device according to the present invention, at least some of the plurality of upper module connection terminals are electrically connectable to corresponding ones of a plurality of lower module connection terminals, respectively, which are provided on the upper module and which are electrically connected to the second semiconductor chip.

Preferably, in the lower module of the stacked semiconductor device according to the present invention, the number of upper module connection terminals is equal to or greater than the number of lower module connection terminals provided on the upper module. With such a structure, multiple types of upper modules can be handled which differ in the number of lower module connection terminals.

Preferably, in the lower module of the stacked semiconductor device according to the present invention, at least one of the plurality of lower module connection terminals is a high-speed signal processing terminal that needs high-speed signal transfer, and a terminal of the plurality of upper module connection terminals electrically connected to the high-speed signal processing terminal is electrically connected to the first chip connection terminal by a surface interconnect provided on the chip holding surface, and also electrically connected to the external substrate connection terminal by a through conductor penetrating the first substrate. With such a structure, the first chip connection terminal, the upper module connection terminal, and the external substrate connection terminal can be electrically connected to each other at the shortest distance. This reduces the impedance of the transmission line of the first substrate. As a result, for example, if a semiconductor memory is employed in the upper module, signals from an address terminal and a data terminal can be processed at high speed and at the same timing. Thereby, a stacked semiconductor module capable of operating at high speed can be provided.

Preferably, in the lower module of the stacked semiconductor device according to the present invention, the first chip connection terminal and the upper module connection terminal are electrically connected by interposing at least either of a surface interconnect provided on the first chip holding surface and an embedded interconnect embedded in the first substrate, and the upper module connection terminal and the external substrate connection terminal are electrically connected by interposing a through conductor penetrating the first substrate or a plurality of non-through conductors formed not to penetrate the first substrate.

Preferably, in the lower module of the stacked semiconductor device according to the present invention, at least one of the upper module connection terminals is electrically connected to the first chip terminal by interposing an embedded interconnect embedded in the first substrate and a non-through conductor electrically connecting the embedded interconnect and the upper module connection terminal, and also electrically connected to the external substrate connection terminal by interposing a through conductor penetrating the first substrate, and the non-through conductor and the through conductor are provided below the upper module connection terminal. With such a structure, a first chip mounting surface is provided with only a minimum necessary interconnect extending around the first connection terminal. In addition, the region below the upper module connection terminal can be utilized effectively, so that the flexibility of interconnection pattern design on the first chip holding surface side of the first substrate can be enhanced to improve the reliability of the semiconductor device.

Preferably, in the above case, the non-through conductor and the through conductor are in contact with different sides of two horizontally-farthest regions of the bottom surface of the upper module connection terminal, respectively. With such a structure, the occurrence of short circuit between the non-through conductor and the through conductor can be reduced. This enables simplification of the test process of the semiconductor device while the reliability of the device is maintained. Moreover, if the upper module connection terminal is protected by a solder resist or the like, overlap of at least portions of the through conductor and the non-through conductor at the opening of the solder resist can be avoided. The through conductor and the non-through conductor may be spaced away from each other so that they are not exposed from the opening of the solder resist. With the approaches described above, the flatness of the upper module connection terminal can be maintained at the opening of the solder resist, and in addition to this, the connection strength in stacking the upper module can also be maintained.

Preferably, in the lower module of the stacked semiconductor device according to the present invention, the first semiconductor chip is held above the first substrate by a flip chip bonding technique, a wire bonding technique, or a tape automated bonding technique.

Preferably, in the lower module of the stacked semiconductor device according to the present invention, a plurality of first semiconductor chips are held above the first chip holding surface. With such a structure, for example, as the first semiconductor chip, use can be made of a combination of a DSP chip and a power supply chip, a combination of a CPU chip and a nonvolatile memory chip, or the like, so that a stacked semiconductor device with a higher functionality can be provided.

Preferably, in the above case, the plurality of first semiconductor chips are held above the first chip holding surface as a stacked chip made by stacking the two first semiconductor chips so that the surfaces of the chips opposite to the surfaces where the first chip terminals are provided face each other, the first chip terminals of one of the two first semiconductor chips are electrically connected to the associated first chip connection terminals by a flip chip bonding technique, and the first chip terminals of the other of the two first semiconductor chips are electrically connected to the associated first chip connection terminals by a wire bonding technique or a tape automated bonding technique. With such a structure, a thin stacked semiconductor device can be provided.

Preferably, in the lower module of the stacked semiconductor device according to the present invention, the external substrate connection terminals are disposed on the entire surface of the first substrate opposite to the first chip holding surface, and the protruding electrode is a ball bump or a pillar bump.

Preferably, in the lower module of the stacked semiconductor device according to the present invention, the first substrate is made of glass epoxy resin, polyimide resin, aramid resin, or ceramic.

A stacked semiconductor device according to the present invention is characterized by comprising: a lower module which includes a first semiconductor chip having a plurality of first chip terminals and a first substrate having a first chip holding surface with a larger plan size than that of the first semiconductor chip and holding the first semiconductor chip above the first chip holding surface; and an upper module which includes a second semiconductor chip having a plurality of second chip terminals and a second substrate having a second chip holding surface with a larger plan size than that of the second semiconductor chip and holding the second semiconductor chip above the second chip holding surface. As a further characteristic, the first substrate includes: a plurality of first chip connection terminals provided on the first chip holding surface and electrically connected to the first chip terminals, respectively; a plurality of upper module connection terminals provided on a portion of the first chip holding surface located outside a region where the first semiconductor chip is held; and a plurality of external substrate connection terminals provided on a surface thereof opposite to the first chip holding surface. As a further example, the first chip connection terminals are electrically connected to the external substrate connection terminals, respectively, and the second connection terminals are electrically connected between the first chip connection terminals and the associated external substrate connection terminals, respectively. As a further characteristic, the second substrate includes: a plurality of second chip connection terminals provided on the second chip holding surface and electrically connected to the associated second chip terminals, respectively; and a plurality of lower module connection terminals provided on a surface thereof located opposite to the second chip holding surface and electrically connected to the associated second chip connection terminals, respectively. As a further characteristic, the lower module and the upper module are stacked with the first chip holding surface facing the surface of the second substrate opposite to the second chip holding surface, and the lower module connection terminals are electrically connected to the associated upper module connection terminals, respectively.

With the stacked semiconductor device of the present invention, the lower module connection terminals are electrically connected to the associated upper module connection terminals. Therefore, in constructing the stacked semiconductor device, holding of the upper module can be done after a continuity test and a reliability test are conducted on the lower module including the upper module connection terminal. This enables significant improvement of the reliability and fabrication yields of the stacked semiconductor device.

Preferably, in the stacked semiconductor device according to the present invention, the second chip terminals are electrically connected to the associated second chip connection terminals by a flip chip bonding technique, a wire bonding technique, or a tape automated bonding technique.

Preferably, in the stacked semiconductor device according to the present invention, a plurality of second semiconductor chips are held above the second chip holding surface.

Preferably, in the above case, the plurality of second semiconductor chips are held above the second chip holding surface as a stacked chip made by stacking the two second semiconductor chips so that the surfaces of the chips opposite to the surfaces where the second chip terminals are provided face each other, the second chip terminals of one of the two second semiconductor chips are electrically connected to the associated second chip connection terminals by a flip chip bonding technique, and the second chip terminals of the other of the two second semiconductor chips are electrically connected to the associated second chip connection terminals by a wire bonding technique or a tape automated bonding technique.

Preferably, in the stacked semiconductor device according to the present invention, the second substrate is made of glass epoxy resin, polyimide resin, aramid resin, or ceramic.

Preferably, in the above case, the first and second substrates are made of the same material. With such a structure, the thermal expansion coefficients of the first and second substrates become identical. Therefore, bowing of the stacked semiconductor device can be prevented easily.

BRIEF DESCRIPTION OF THE DRAWINGS

FIG. 2A is a plan view thereof, and FIG. 2B is a sectional view thereof taken along the line IIb-IIb in FIG. 2A.

FIG. 9A is a plan view thereof, and FIG. 9B is a sectional view thereof taken along the line IXb-IXb in FIG. 9A.

DETAILED DESCRIPTION OF THE PREFERRED EMBODIMENTS

First Embodiment

Figure 1:
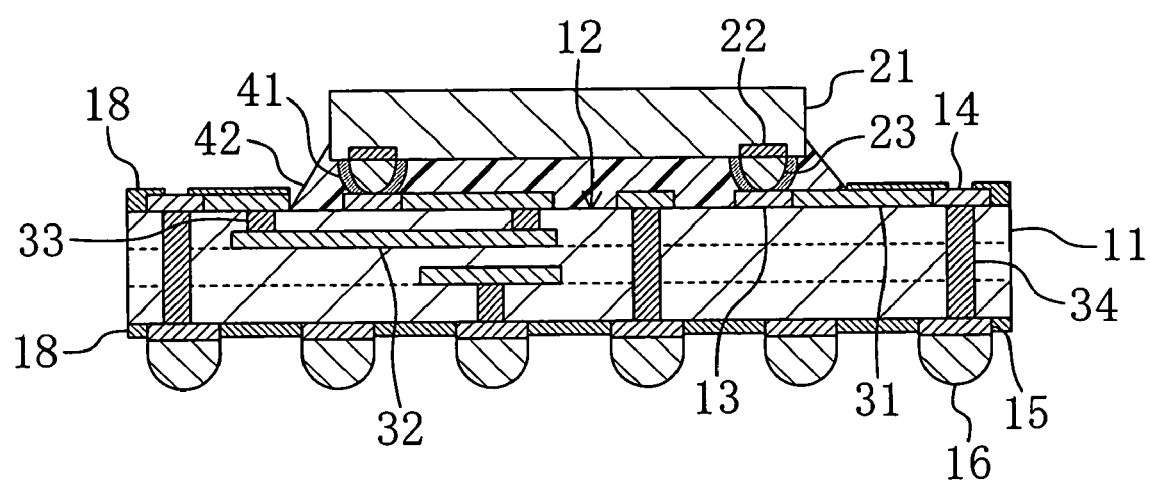
FIG. 1 is a sectional view showing a lower module of a stacked semiconductor device according to a first embodiment of the present invention.

FIG. 1 shows a cross-sectional structure of a lower module for a stacked semiconductor device according to a first embodiment of the present invention. In FIG. 1, terminals, electrodes, interconnects, and other components are illustrated with the numbers and shapes of them omitted or simplified in easy-to-illustrate foam. Also, the same omission and simplification are done in all drawings that follow.

Referring to FIG. 1, the lower module of the first embodiment is composed of a first substrate 11 and a first semiconductor chip 21 held above the first substrate 11.

As shown in FIG. 1, the first semiconductor chip 21 in the first embodiment is formed in a chip substrate of a quadrangular planar shape. The center portion of the chip substrate is provided with an integrated circuit formation region (not shown) where a semiconductor element is formed, and a plurality of first chip terminals 22 are disposed outside this region. Note that the first chip terminals 22 may be disposed inside the integrated circuit formation region.

The first chip terminals 22 are generally made of metal identical to the metal used for formation of interconnects of the integrated circuit, and specifically made of aluminum, copper, a stacked material of aluminum and copper, or the like. The surface of the chip substrate other than the regions formed with the first chip terminals 22 (referred to as openings) is covered with an insulating film (not shown) such as a solder resist. Note that the surfaces of the openings may be subjected to surface treatment such as nickel gold plating.

In the first embodiment, the first semiconductor chip 21 is flip chip bonded to the first substrate 11, and each of the first chip terminals 22 is provided with a protruding electrode 23. It is sufficient that the protruding electrode 23 is made of a simple substance of, or a stacked structure of two or more of solder, gold, copper, nickel, and the like, and is a spherical or pillar bump in shape. It is sufficient that the protruding electrode 23 is formed by a publicly-known technique such as a wire bump bonding technique or a plating technique.

The first substrate 11 has a principal surface with a larger plan size than that of the first semiconductor chip 21, and has a multilayer interconnection structure. The top of a chip holding surface 12, which is the top surface of the first substrate 11, is provided with a plurality of first chip connection terminals 13. In the first embodiment, the first chip connection terminals 13 are formed in locations corresponding to the protruding electrodes 23, respectively, which are provided on the first semiconductor chip 21 disposed in a substantially center portion of the chip holding surface 12. The first chip connection terminals 13 are electrically connected with conductive adhesives 41 to the protruding electrodes 23 of the first semiconductor chip 21, respectively.

A portion of the chip holding surface 12 located outside the region where the first semiconductor chip 21 is held is provided with a plurality of upper module connection terminals 14 for making connection to an upper module (not shown) of the stacked semiconductor device.

The upper module connection terminals 14 are provided to surround a region of the chip holding surface 12 where the first semiconductor chip 21 is disposed, and provided at locations corresponding to lower module connection terminals included in the upper module that will be described later. Note that in order to stack various types of upper modules differing in the number of lower module connection terminals, it is sufficient that the number of upper module connection terminals 14 provided is in accordance with the number of lower module connection terminals of an upper module having a greatest number of those terminals. Therefore, if an upper module having a few number of lower module connection terminals is stacked, some of the upper module connection terminals 14 may not be connected to the lower module connection terminal.

On the surface (the back surface) of the first substrate 11 opposite to the chip holding surface 12, a plurality of external substrate connection terminals 15 are disposed in an equally-spaced grid pattern. The external substrate connection terminals 15 are provided with protruding electrodes 16, respectively, and the external substrate connection terminals 15 are electrically connectable to an external substrate (not shown).

Figure 2A:
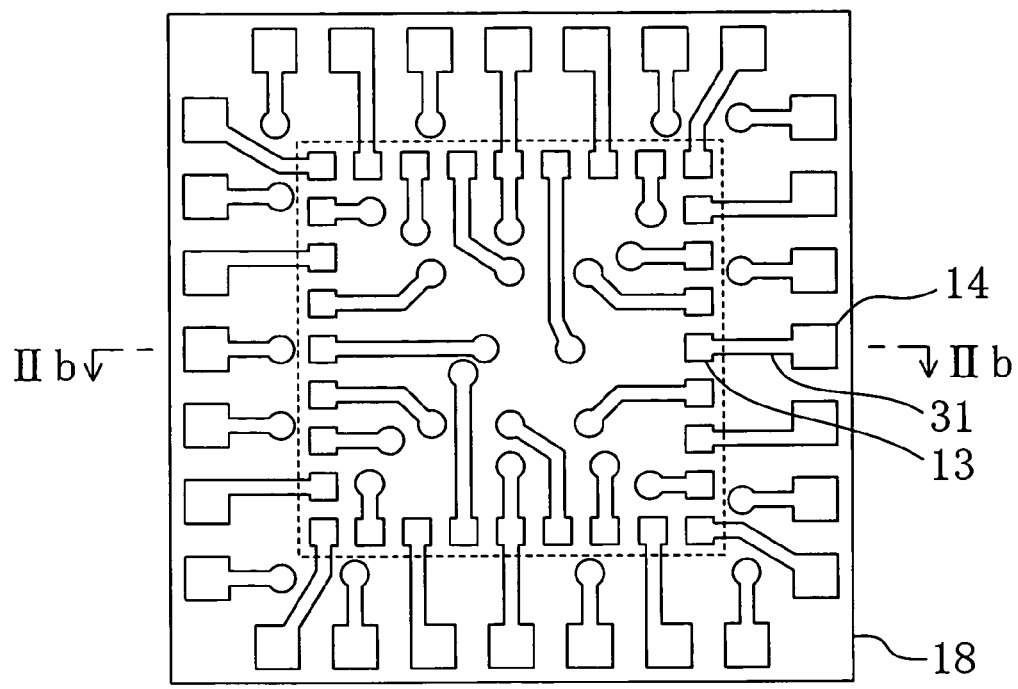
FIGS. 2A and 2B show a substrate portion of the lower module of the stacked semiconductor device according to the first embodiment of the present invention.
Figure 2B:
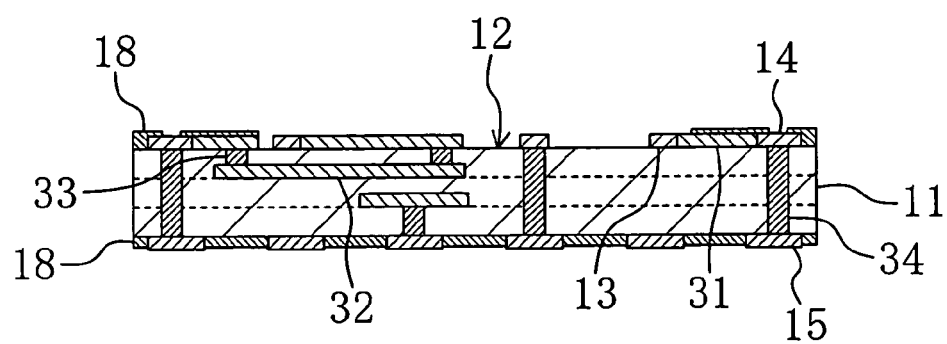

FIGS. 2A and 2B show details of the first substrate 11 according to the first embodiment. FIG. 2A shows a plan structure thereof, and FIG. 2B shows a cross-sectional structure taken along the line IIb-IIb in FIG. 2A.

The first substrate 11 is made of aramid resin, glass epoxy resin, polyimide resin, ceramic, or the like. The chip holding surface 12 and the back surface of the first substrate 11 other than the regions formed with the connection terminals are formed with an insulating film 18 made of solder resist, polyimide, or the like.

Each of the first chip connection terminals 13 is electrically connected to an associated one of the plurality of external substrate connection terminals 15. Each of the upper module connection terminals 14 is electrically connected in serial between the first chip connection terminal 13 and the external substrate connection terminal 15. That is to say, each of the upper module connection terminals 14 is electrically connected to an associated one of the first chip connection terminals 13, and also to an associated one of the external substrate connection terminals 15.

The first chip connection terminal 13 and the upper module connection terminal 14 may be directly connected by a surface interconnect 31 provided on the chip holding surface 12, or may be connected by interposing therebetween an embedded interconnect 32 and a non-through conductor 33 embedded within the first substrate 11. The upper module connection terminal 14 and the external substrate connection terminal 15 may be directly connected by a through conductor 34 penetrating the first substrate 11, or may be connected by interposing therebetween the surface interconnect 31, the embedded interconnect 32, the non-through conductor 33, and the like. Some of the first chip connection terminals 13 may be connected directly to the external substrate connection terminals 15, respectively, without interposing the upper module connection terminal 14. The external substrate connection terminal 15 may be connected to the non-through conductor 33 and the through conductor 34 by interposing a backside interconnect (not shown) provided on the backside of the first substrate 11.

As described above, by connecting the upper module connection terminal 14 in series between the first chip connection terminal 13 and the external substrate connection terminal 15, the protruding electrode 16 can be used to simultaneously conduct functional tests on the first semiconductor chip 21 and a continuity test on the upper module connection terminal 14. Furthermore, in this continuity test, it is unnecessary to bring a probe into contact with the surface of the upper module connection terminal 14, so that the possibility of damage to the surface of the upper module connection terminal 14 is eliminated. Therefore, when the upper module is stacked using the upper module connection terminal 14, the occurrence of poor connection or degradation of the connection reliability can be prevented.

Next description will be made of a fabrication method of the lower module according to the first embodiment. First, the surface of the first semiconductor chip 21 formed with the protruding electrode 23 is faced toward the chip holding surface 12 of the first substrate 11. Position alignment between the first chip connection terminal 13 and the protruding electrode 23 is performed and they are connected by the conductive adhesive 41. Then, underfill resin 42 is injected into a space between the chip holding surface 12 and the first semiconductor chip 21 to provide adhesion and sealing. Preferably, heating is performed in order to promote curing of the conductive adhesive 41 and the underfill resin 42. The first semiconductor chip 21 and the first substrate 11 may be connected not by using the underfill resin 42 but, for example, by shrinking a non-conductive resin film by curing.

Next, the ball-shaped or pillar protruding electrodes 16 made of solder, gold, copper, nickel, or the like are joined with, for example, solder (not shown) to the external substrate connection terminals 15 disposed in a grid pattern on the entire back surface of the first substrate 11. As the protruding electrode 16, a resin ball may be employed which has a surface layer subjected to metal evaporation to impart conductivity.

The lower module according to the first embodiment can mount the upper module through the upper module connection terminal 14 to construct the stacked semiconductor device, but it can also be used singly. Even in this case, functional tests of the first semiconductor chip 21 and a continuity test on the upper module connection terminal 14 can be simultaneously conducted through the protruding electrode 16. Furthermore, in this continuity test, it is unnecessary to bring a probe into contact with the surface of the upper module connection terminal 14, so that the possibility of damage to the surface of the upper module connection terminal 14 is eliminated. As a result of this, even when the upper module provided with a second semiconductor chip is mounted to the lower module, the occurrence of poor connection or degradation of the connection reliability can be prevented.

In the first substrate 11, the electrically serial connection of the first chip connection terminal 13, the upper module connection terminal 14, and the external substrate connection terminal 15 may be made not only in the construction shown above but also in another construction.

For example, in the case of the construction in which the first chip connection terminal 13 and the upper module connection terminal 14 are electrically connected by the surface interconnect 31 and the upper module connection terminal 14 and the external substrate connection terminal 15 are connected by the through conductor 34, these connections can be made by a conductive pattern with the shortest length. Therefore, this construction is desirably employed for a terminal that needs high-speed signal processing. For example, in the case where the upper module stacked and mounted to the first substrate 11 is a DRAM (Dynamic Random Access Memory) or the like, use of this construction for a terminal thereof required to conduct high speed signal processing, such as a data terminal or an address terminal, allows high speed processing as a stacked semiconductor device. In particular, this construction can offer effective use in the frequency range above 100 MHz.

Moreover, other than the construction shown above, the surface interconnect, the embedded interconnect, the non-through conductor, the through conductor, and the backside interconnect can be designed freely in arbitrary combinations according to an interconnection pattern provided in the surface and the inside of the first substrate 11.

First Modification of First Embodiment

Figure 3:
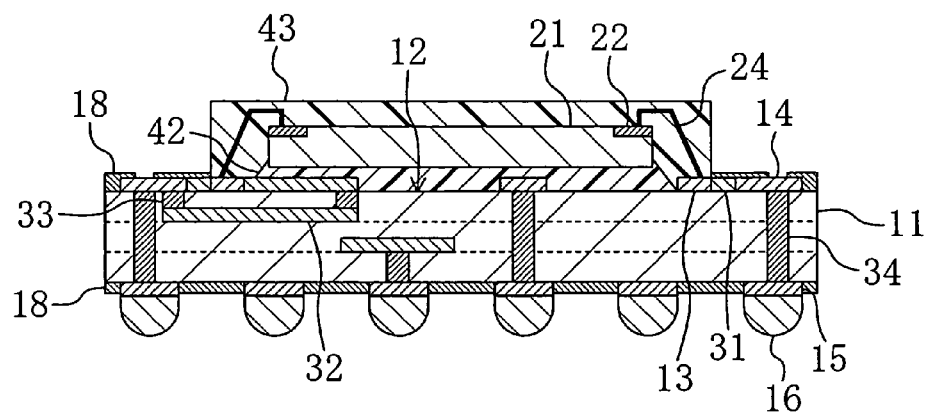
FIG. 3 is a sectional view showing a lower module of a stacked semiconductor device according to a first modification of the first embodiment of the present invention.

FIG. 3 shows a cross-sectional structure of a lower module according to a first modification of the first embodiment. The description of the components in FIG. 3 that are the same as those in FIG. 1 will be omitted by retaining the same reference numerals. As shown in FIG. 3, in the lower module of the first modification, a wire lead 24 connects the first chip terminal 22 of the first semiconductor chip 21 to the first chip connection terminal 13 of the first substrate 11.

Further, in order to protect the wire lead 24, a protective resin 43 is provided which covers the first semiconductor chip 21 and the wire lead 24.

Note that instead of the structure in which connection is made by the wire lead 24, the structure may be employed in which the first semiconductor chip 21 is mounted to the first substrate 11 by using a tape automated bonding (TAB).

Second Modification of First Embodiment

Figure 4:
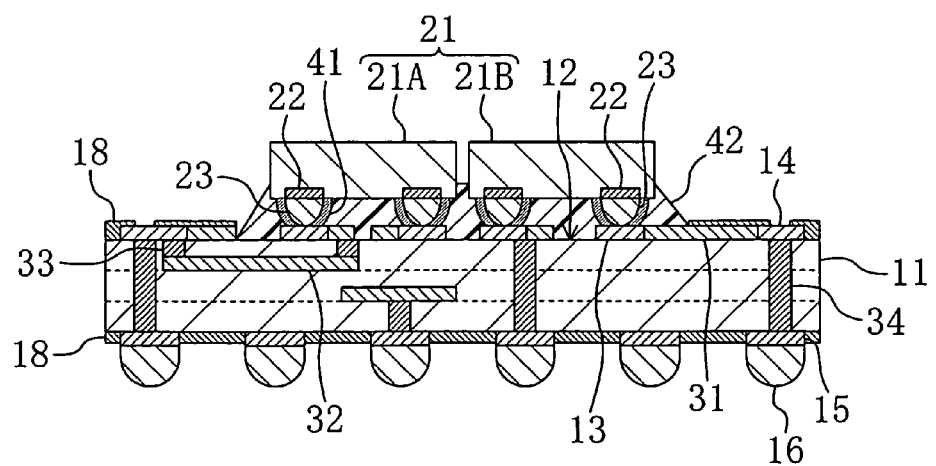
FIG. 4 is a sectional view showing a lower module of a stacked semiconductor device according to a second modification of the first embodiment of the present invention.

FIG. 4 shows a cross-sectional structure of a lower module according to a second modification of the first embodiment. The description of the components in FIG. 4 that are the same as those in FIG. 1 will be omitted by retaining the same reference numerals. As shown in FIG. 4, in the lower module of the second modification, two first semiconductor chips 21 are held in adjacent relation above the first substrate 11. For example, a digital signal processor (DSP) chip 21A and a power supply chip 21B are held as the first semiconductor chip 21. Alternatively, a combination of other multiple chips, such as a combination of a CPU chip and a nonvolatile memory chip, may be employed thereas.

In the second modification, two semiconductor chips are mounted by a flip chip bonding technique. Alternatively, they may be mounted by a wire bonding technique or a TAB technique. The two semiconductor chips may be mounted by arranging them in layers and then mounting one of them by a flip chip bonding technique and the other by a wire bonding technique.

Third Modification of First Embodiment

Figure 5:
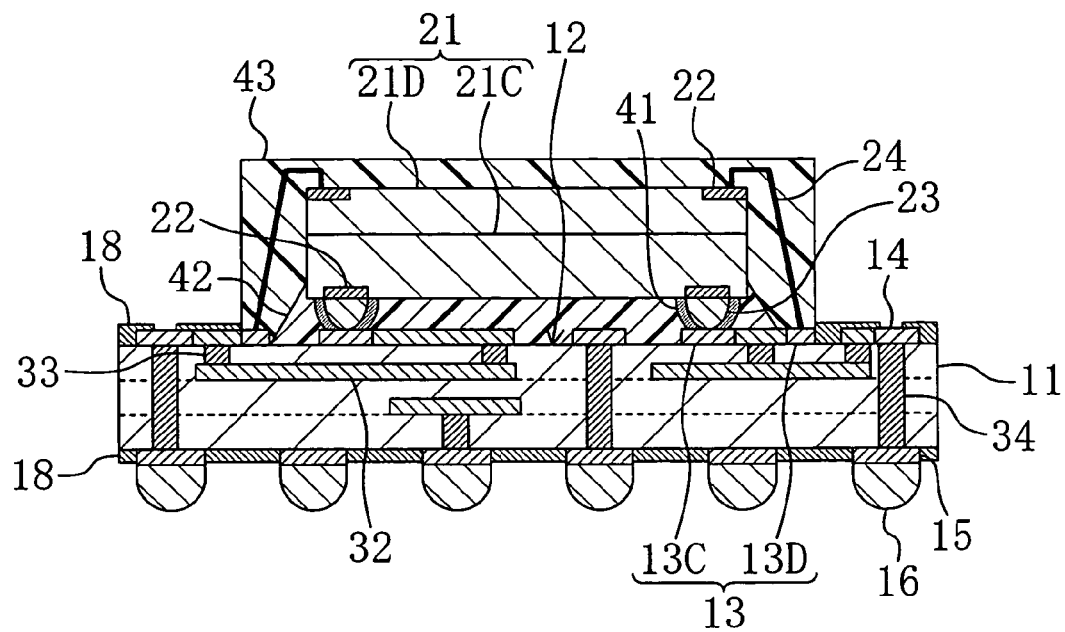
FIG. 5 is a sectional view showing a lower module of a stacked semiconductor device according to a third modification of the first embodiment of the present invention.

FIG. 5 shows a cross-sectional structure of a lower module according to a third modification of the first embodiment. The description of the components in FIG. 5 that are the same as those in FIG. 1 will be omitted by retaining the same reference numerals. As shown in FIG. 5, in the lower module of the third modification, a plurality of first semiconductor chips 21 are held in stacked relation above the first substrate 11. For example, the first semiconductor chip 21 in the third modification has a DSP chip 21C and a semiconductor memory chip 21D stacked therein. The DSP chip 21C is mounted by a flip chip bonding technique, while the semiconductor memory chip 21D is mounted by a wire bonding technique.

In the third modification, the first chip connection terminal 13 is composed of: a bump connection terminal 13C for mounting the DSP chip 21C by a flip chip bonding technique; and a wire connection terminal 13D for connecting the semiconductor memory chip 21D by a wire bonding technique.

The protruding electrode 23 of the DSP chip 21C and the bump connection terminal 13C are connected by, for example, the conductive adhesive 41, and the underfill resin 42 is then applied for filling. Subsequently, the semiconductor memory chip 21D is stuck on the DSP chip 21C, and then the wire lead 24 connects a connection electrode (not shown) of the semiconductor memory chip 21D and the wire connection terminal 13D.

In the third modification, the protective resin 43 for protecting the first semiconductor chip 21 and the wire lead 24 is provided to cover the first semiconductor chip 21 and the wire lead 24.

In the third modification, description has been made of the structure in which the two semiconductor chips are mounted by a flip chip bonding technique and a wire bonding technique, respectively. Alternatively, this mounting may be done by only the wire bonding technique, only a TAB technique, or a combination of these techniques. The first semiconductor chip may be made by combining any types of chips.

Fourth Modification of First Embodiment

Figure 6:
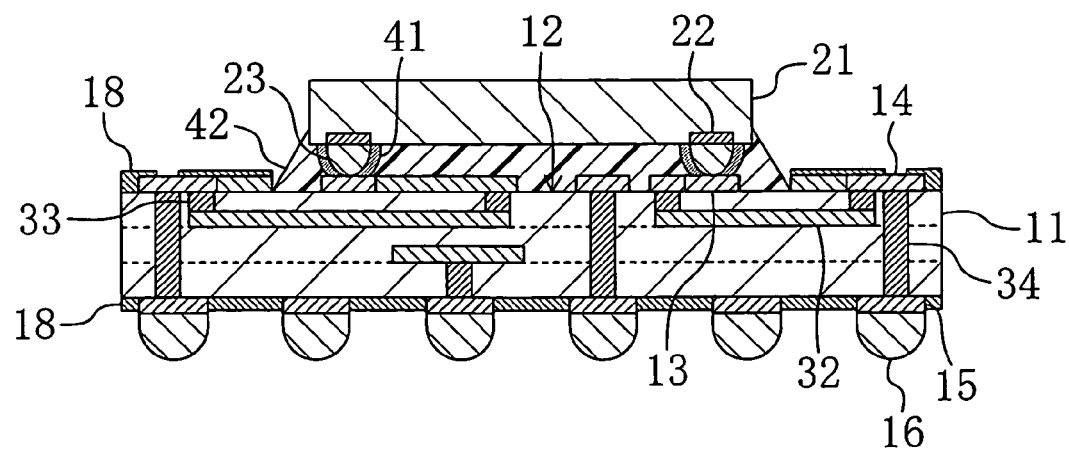
FIG. 6 is a sectional view showing a lower module of a stacked semiconductor device according to a fourth modification of the first embodiment of the present invention.

FIG. 6 shows a cross-sectional structure of a lower module according to a fourth modification of the first embodiment. The description of the components in FIG. 6 that are the same as those in FIG. 1 will be omitted by retaining the same reference numerals. As shown in FIG. 6, in the lower module of the fourth modification, no surface interconnect 31 connected to the upper module connection terminal 14 is provided, the through conductor 34 and the non-through conductor 33 are connected directly to the upper module connection terminal 14, and the first chip connection terminal 13 and the upper module connection terminal 14 are electrically connected by interposing the non-through conductor 33 and the embedded interconnect 32 therebetween. Thus, it is unnecessary to provide the surface interconnect 31 on a portion of the chip holding surface 12 located outside the region where the first semiconductor chip 21 is held, which enables significant improvement of the flexibility of the interconnection pattern design. Moreover, the through conductor 34 and the non-through conductor 33 are provided immediately below the upper module connection terminal 14. Since the region immediately below the upper module connection terminal 14 is typically empty space, this region can be used as an interconnection region as shown above to secure an interconnection space.

Note that such a construction does not have to be employed for all of the upper module connection terminals 14. Such a construction may be employed for only an upper module connection terminal 14 particularly necessary for the interconnection pattern design.

Figure 7:
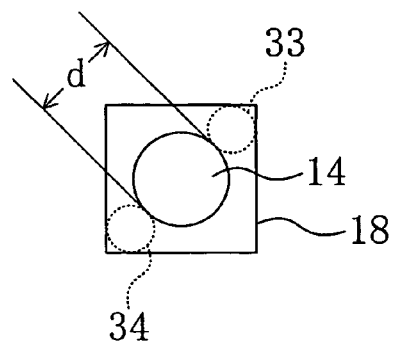
FIG. 7 is an enlarged plan view showing an upper module connection terminal portion of the lower module of the stacked semiconductor device according to another example of the fourth modification of the first embodiment of the present invention.

In the fourth modification, placement of the non-through conductor 33 and the through conductor 34 relative to the upper module connection terminal 14 may be made as shown in FIG. 7. FIG. 7 shows an enlarged plan structure of a portion of the lower module provided with the upper module connection terminal 14. As shown in FIG. 7, the non-through conductor 33 and the through conductor 34 are connected in the state in which they are spaced apart at the opposing corners of the upper module connection terminal 14, respectively. This placement can attain the longest distance between the non-through conductor 33 and the through conductor 34.

With this construction, the possibility of electrical short circuit between the non-through conductor 33 and the through conductor 34 can be reduced to decrease or eliminate the percentage of the first substrates 11 inspected during the fabrication process.

If the non-through conductor 33 and the through conductor 34 are short-circuited at a location other than the upper module connection terminal 14, the assurance of the module including a path to a second connection terminal cannot be offered. Although during fabrication of the first substrate 11, short circuit between the non-through conductor 33 and the through conductor 34 can be inspected by visual observations in forming via holes for the non-through conductor 33 and the through conductor 34, fabrication costs increases. To avoid this drawback, it is preferable to increase the distance d between the non-through conductor 33 and the through conductor 34 connected to the upper module connection terminal 14 as great as possible to prevent short circuit therebetween.

By employing the construction as shown in FIG. 7 in which the non-through conductor 33 and the through conductor 34 are spaced apart at the opposing corners of the upper module connection terminal 14, the possibility of electrical short circuit between the non-through conductor 33 and the through conductor 34 can be significantly reduced while the flexibility of the interconnection pattern design on the chip holding surface side of the first substrate 11 is maintained. Therefore, inspections on the first substrate 11 can be simplified or eliminated. Moreover, portions of the non-through conductor 33 and the through conductor 34 can be prevented from being connected to part of the upper module connection terminal 14 located in the opening of the solder resist 18, so that the flatness of the upper module connection terminal can be maintained at the opening of the solder resist 18. Furthermore, the connection strength can also be maintained in stacking the upper module.

Second Embodiment

Figure 8:
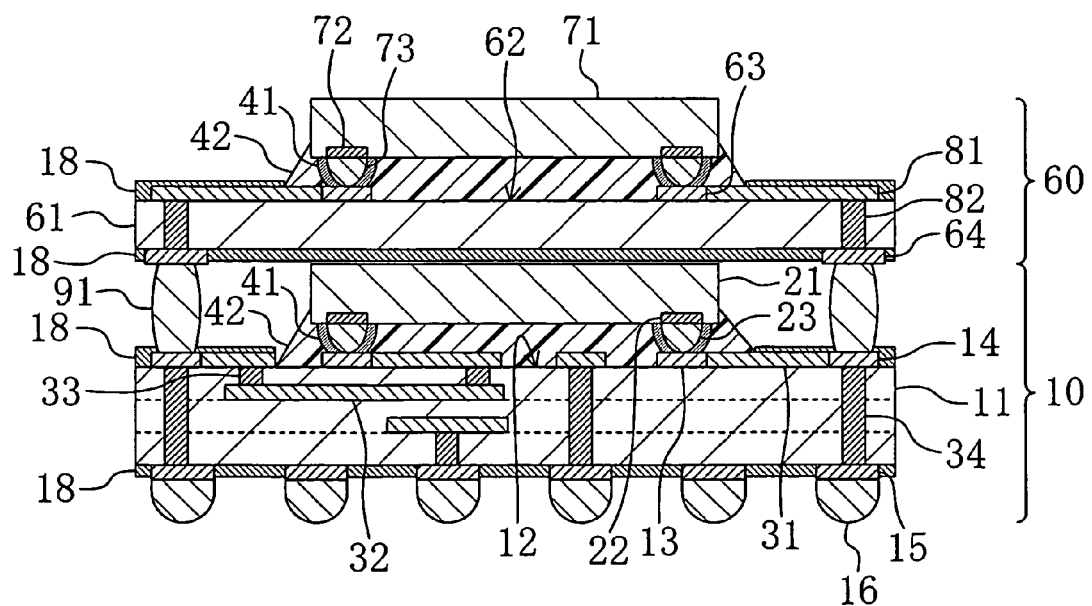
FIG. 8 is a sectional view showing a stacked semiconductor device according to a second embodiment of the present invention.

Hereinafter, a second embodiment of the present invention will be described with reference to the accompanying drawings. FIG. 8 shows a cross-sectional structure of a stacked semiconductor device according to a second embodiment of the present invention. The description of the components in FIG. 8 that are the same as those in FIG. 1 will be omitted by retaining the same reference numerals. The stacked semiconductor device of the second embodiment is fabricated by stacking an upper module 60 over the lower module 10. In the second embodiment, the lower module 10 is identical to the lower module according to the first modification of the first embodiment. The upper module 60 is composed of a second substrate 61 and a second semiconductor chip 71 held above the second substrate 61.

Figure 9A:
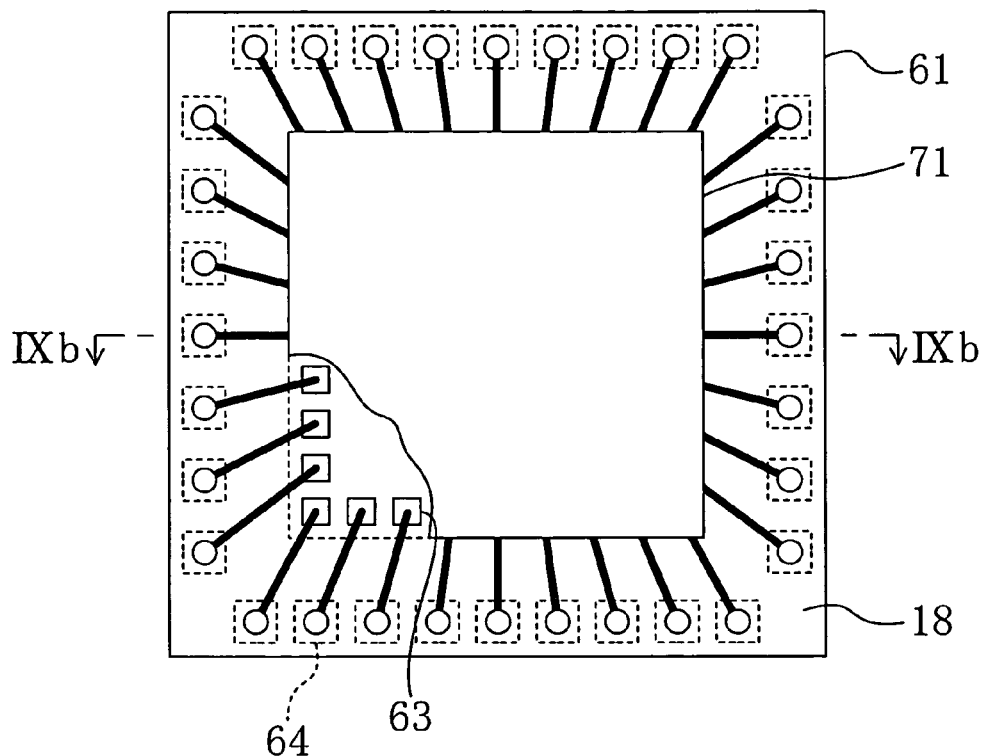
FIGS. 9A and 9B show a substrate of an upper module of the stacked semiconductor device according to the second embodiment of the present invention.
Figure 9B:
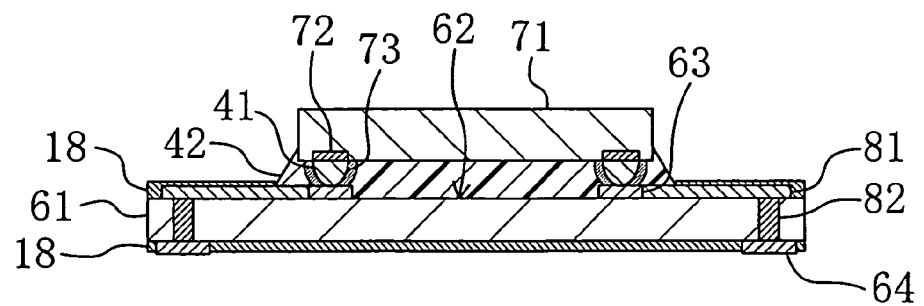

FIGS. 9A and 9B show the upper module 60 according to the second embodiment. FIG. 9A shows a plan structure thereof, and FIG. 9B shows a cross-sectional structure thereof taken along the line IXb-IXb in FIG. 9A. For the sake of clarity, in FIG. 9A, part of the second semiconductor chip 71 is illustrated as a cutaway view.

Referring to FIGS. 9A and 9B, in the surface of the quadrangular second semiconductor chip 71 closer to the principal surface of the substrate, the center portion thereof is provided with an integrated circuit formation region (not shown), and a plurality of second chip terminals 72 are formed to surround the integrated circuit formation region. Note that the second chip terminal may be disposed inside the integrated circuit formation region.

In the second embodiment, the second semiconductor chip 71 is flip chip bonded to the second substrate 61, and each of the second chip terminals 72 is provided with a protruding electrode 73. It is sufficient that the protruding electrode 73 is made of a simple substance of, or a stacked structure of two or more of solder, gold, copper, nickel, and the like, and is a spherical or pillar bump in shape. It is sufficient that the protruding electrode 73 is formed by a publicly-known technique such as a wire bump bonding technique or a plating technique.

A space between the second semiconductor chip 71 and the second substrate 61 is filled with the underfill resin 42.

The second substrate 61 is made of glass epoxy resin or the like and has a principal surface with a larger plan size than that of the second semiconductor chip 71. The top of a chip holding surface 62, which is the top surface of the second substrate 61, is provided with a plurality of second chip connection terminals 63. In the second embodiment, the second chip connection terminals 63 are formed in locations corresponding to the protruding electrodes 73, respectively, which are provided on the second semiconductor chip 71 disposed in a substantially center portion of the chip holding surface 62. The second chip connection terminals 63 are electrically connected with conductive adhesives 41 to the protruding electrodes 73 of the second semiconductor chip 71, respectively.

The surface (the back surface) of the second substrate 61 opposite to the chip holding surface 62 is formed with a plurality of lower module connection terminals 64 to surround the perimeter of the second substrate 61. The second chip connection terminal 63 and the lower module connection terminal 64 are electrically connected by interposing therebetween a surface interconnect 81 formed on the chip holding surface 62 and a through conductor 82.

Note that if necessary, an embedded interconnect and a non-through conductor may be provided inside the second substrate 61, and may be used to connect the second chip connection terminal 63 and the lower module connection terminal 64.

The second chip connection terminals 63 are formed at locations corresponding to the protruding electrodes 73 of the second semiconductor chip 71, respectively. The lower module connection terminals 64 are disposed at locations corresponding to the upper module connection terminals 14 of the lower module 10, respectively.

With the position of the upper module 60 adjusted relative to the lower module 10, the upper module 60 is placed above the lower module 10. Then, the two modules are connected with a conductive connecting member 91 to fabricate a stacked semiconductor device of the second embodiment. As the conductive connecting member 91, use can be made of, for example, a ball or a pillar body of metal such as solder, gold, silver, or a resin ball or a pillar body with a surface exhibiting conductivity.

With this stacked semiconductor device, during functional tests of the lower module 10 disposed in the lowermost layer, a continuity test of the upper module connection terminal 14 can be simultaneously conducted. Therefore, the percentage of the stacked semiconductor devices judged to be defective after stacking and mounting can be decreased significantly, which greatly improves fabrication yields.

In fabricating the stacked semiconductor device, the connection method of the respective connection portions should be chosen appropriately. Specifically, a material and a connection temperature set appropriately are required for connection between the protruding electrode 23 of the first semiconductor chip 21 and the first chip connection terminal 13, connection between the protruding electrode 73 of the second semiconductor chip 71 and the second chip connection terminal 63, connection between the lower module 10 and the upper module 60, connection between the lower module 10 and the external substrate, and the like.

As a preferable example, connection between the protruding electrode 23 of the first semiconductor chip 21 and the first substrate 11 and connection between the protruding electrode 73 of the second semiconductor chip 71 and the second substrate 61 are made by using a conductive adhesive or an anisotropic conductive connecting member, and connection between the lower module 10 and the upper module 60 and connection between the lower module 1 and the external substrate are made by using solder materials with different melting points, respectively.

Modification of Second Embodiment

Figure 10:
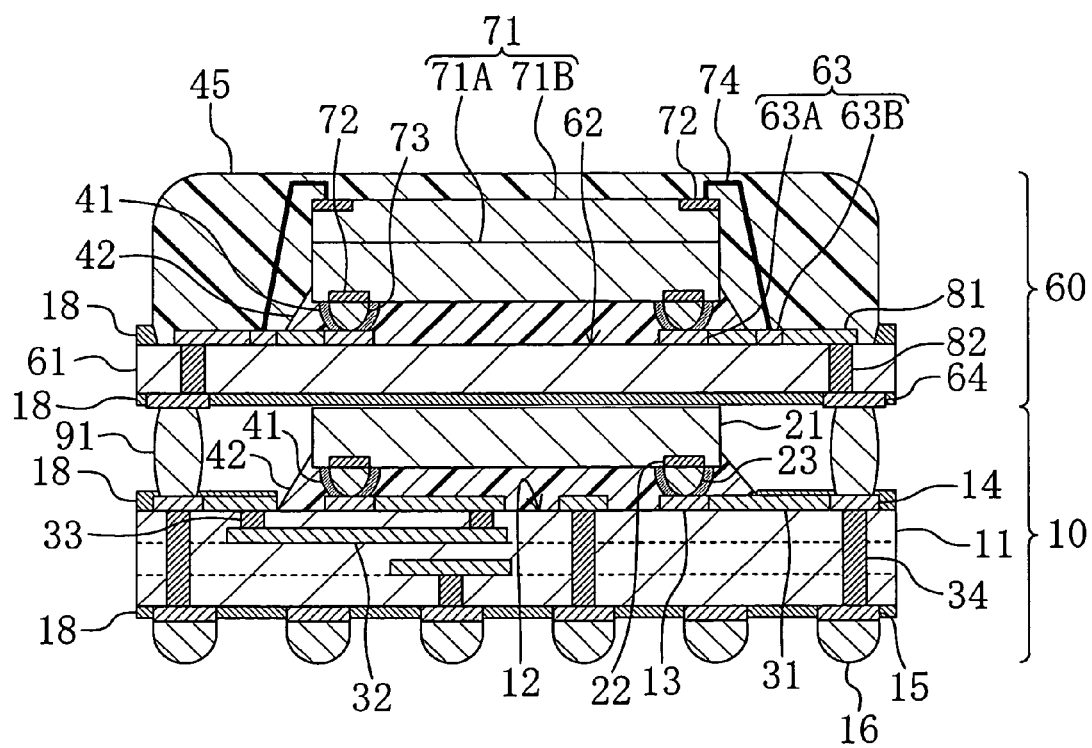
FIG. 10 is a sectional view showing a stacked semiconductor device according to one modification of the second embodiment of the present invention.

One modification of the second embodiment will be described below with reference to the accompanying drawings. FIG. 10 shows a cross-sectional structure of a stacked semiconductor device according to this modification. The description of the components in FIG. 10 that are the same as those in FIG. 8 will be omitted by retaining the same reference numerals. In this modification, the upper module 60 is composed of the second substrate 61 and semiconductor chips 71A and 71B held above the second substrate 61.

Description will be made of an exemplary case where the semiconductor chips 71A and 71B are semiconductor memory chips. The semiconductor chip 71A is mounted above the second substrate 61 by a flip chip bonding technique, while the semiconductor chip 71B is mounted above the second substrate 61 by a wire bonding technique.

With this construction, the second chip connection terminal 63 of the second substrate 61 is composed of: a bump connection terminal 63A for connecting the semiconductor chip 71A by a flip chip bonding technique; and a wire connection terminal 63B for connecting the semiconductor chip 71B by a wire bonding technique.

The protruding electrode 73 of the semiconductor chip 71A and the bump connection terminal 63A of the second substrate 61 are connected by, for example, the conductive adhesive 41, and a space between the semiconductor chip 71A and the second substrate 61 is filled with the underfill resin 42.

The semiconductor chip 71B is stuck on the semiconductor chip 71A, and a wire lead 74 connects the second chip terminal 72 of the semiconductor chip 71B and the wire connection terminal 63B.

In this modification, a protective resin 45 for protecting the entire surface of the upper module 60 is provided.

For the stacked semiconductor device of this modification, the plurality of semiconductor chips are held in the upper module. Thus, the functionality of the second semiconductor chip, such as a memory capacity, can be enhanced to provide a compact stacked semiconductor device with high functionality.

In the second embodiment and its modification, description has been made of the example in which glass epoxy resin is used as a base material for the second substrate, but the present invention is not limited to this material. As the base material for the second substrate, use may be made of, other than glass epoxy resin, polyimide resin, aramid resin, ceramic, or the like. An alternative approach in which the first and second substrates are made of the same base material is preferable in that bowing of the substrates due to the difference in thermal expansion coefficient can be avoided.

In the second embodiment and its modification, description has been made of the example in which the lower module shown in the first modification of the first embodiment is employed. Alternatively, the lower module shown in another embodiment or modification may be employed.

In the respective embodiments and their modifications, the through conductor is a conductor for electrically connecting the top and bottom surfaces of a substrate with a multilayer interconnection structure by penetrating the layers of the substrate. The non-through conductor is a conductor for electrically connecting interconnect layers or an interconnect layer and the top or bottom surface of the substrate, and may be not only a conductor which is formed in an opening not penetrating the substrate as exemplarily shown in FIG. 1, but also a conductor which is formed in a through hole penetrating the substrate from top to bottom but which is insulated at some midpoint to make no electrical connection between the top and bottom surfaces thereof. This is identical to substrates that exist now.

As described above, with the stacked semiconductor device and its lower module according to the present invention, inspections of the stacked semiconductor device including the connection terminals can be facilitated to provide a highly-reliable stacked semiconductor device. Accordingly, the present invention is useful for a stacked semiconductor device, a lower module thereof, and the like fabricated by stacking a plurality of semiconductor devices.

What is claimed is:

1. A lower module of a stacked semiconductor device comprising:
   a first semiconductor chip having a plurality of first chip terminals; and
   a first substrate having a first chip holding surface with a larger plan size than that of the first semiconductor chip and holding the first semiconductor chip above the first chip holding surface,
   wherein the first substrate includes:
   a plurality of first chip connection terminals provided on the first chip holding surface and electrically connected to the first chip terminals, respectively;
   a plurality of upper module connection terminals which are provided on a portion of the first chip holding surface located outside a region where the first semiconductor chip is held and which are electrically connectable to an upper module provided with a second semiconductor chip; and
   a plurality of external substrate connection terminals provided on a surface thereof opposite to the first chip holding surface,
   the first chip connection terminals are electrically connected to the external substrate connection terminals, respectively,
   the upper module connection terminals are electrically connected between the first chip connection terminals and the associated external substrate connection terminals, respectively, and
   the first chip connection terminals and the upper module connection terminals are connected by an interconnect channel passing through a non-through conductor formed not to penetrate the first substrate, and separated from each other on the first chip holding surface.

2. The lower module of claim 1,
   wherein each of the external substrate connection terminals is provided with a protruding electrode capable of making connection to an external substrate.

3. The lower module of claim 1,
   wherein at least some of the plurality of upper module connection terminals are electrically connectable to corresponding ones of a plurality of lower module connection terminals, respectively, which are provided on the upper module and which are electrically connected to the second semiconductor chip.

4. The lower module of claim 3,
   wherein the number of upper module connection terminals is equal to or greater than the number of lower module connection terminals.

5. The lower module of claim 1,
   wherein the first chip connection terminal and the upper module connection terminal are electrically connected by interposing an embedded interconnect embedded in the first substrate, and
   the upper module connection terminal and the external substrate connection terminal are electrically connected by interposing a through conductor penetrating the first substrate.

6. The lower module of claim 1,
   wherein at least one of the upper module connection terminals is electrically connected to the first chip connection terminal by interposing an embedded interconnect embedded in the first substrate, and also electrically connected to the external substrate connection terminal by interposing a through conductor penetrating the first substrate, and
   the non-through conductor and the through conductor are provided below the upper module connection terminal.

7. The lower module of claim 6,
   wherein the non-through conductor and the through conductor are in contact with different sides of two horizontally-farthest regions of the bottom surface of the upper module connection terminal, respectively.

8. The lower module of claim 1,
   wherein the first semiconductor chip is held above the first substrate by a flip chip bonding technique, a wire bonding technique, or a tape automated bonding technique.

9. The lower module of claim 1,
   wherein a plurality of first semiconductor chips are held above the first chip holding surface.

10. The lower module of claim 9,
    wherein the plurality of first semiconductor chips are held above the first chip holding surface as a stacked chip made by stacking the two first semiconductor chips so that the surfaces of the chips opposite to the surfaces where the first chip terminals are provided face each other,
    the first chip terminals of one of the two first semiconductor chips are electrically connected to the associated first chip connection terminals by a flip chip bonding technique, and
    the first chip terminals of the other of the two first semiconductor chips are electrically connected to the associated first chip connection terminals by a wire bonding technique or a tape automated bonding technique.

11. The lower module of claim 1,
    wherein the external substrate connection terminals are disposed on the entire surface of the first substrate opposite to the first chip holding surface, and
    the protruding electrode is a ball bump or a pillar bump.

12. The lower module of claim 1,
    wherein the first substrate is made of glass epoxy resin, polyimide resin, aramid resin, or ceramic.

13. A stacked semiconductor device comprising:
    a lower module which includes a first semiconductor chip having a plurality of first chip terminals and a first substrate having a first chip holding surface with a larger plan size than that of the first semiconductor chip and holding the first semiconductor chip above the first chip holding surface; and
    an upper module which includes a second semiconductor chip having a plurality of second chip terminals and a second substrate having a second chip holding surface with a larger plan size than that of the second semiconductor chip and holding the second semiconductor chip above the second chip holding surface, wherein the first substrate includes:

a plurality of first chip connection terminals provided on the first chip holding surface and electrically connected to the first chip terminals, respectively;

a plurality of upper module connection terminals provided on a portion of the first chip holding surface located outside a region where the first semiconductor chip is held; and a plurality of external substrate connection terminals provided on a surface thereof opposite to the first chip holding surface, the first chip connection terminals are electrically connected to the external substrate connection terminals, respectively, the second connection terminals are electrically connected between the first chip connection terminals and the associated external substrate connection terminals, respectively, the first chip connection terminals and the upper module connection terminals are connected by an interconnect channel passing through a non-through conductor formed not to penetrate the first substrate, and separated from each other on the first chip holding surface, the second substrate includes:

a plurality of second chip connection terminals provided on the second chip holding surface and electrically connected to the associated second chip terminals, respectively; and a plurality of lower module connection terminals provided on a surface thereof located opposite to the second chip holding surface and electrically connected to the associated second chip connection terminals, respectively, the lower module and the upper module are stacked with the first chip holding surface facing the surface of the second substrate opposite to the second chip holding surface, and the lower module connection terminals are electrically connected to the associated upper module connection terminals, respectively.

14. The device of claim 13, wherein the second chip terminals are electrically connected to the associated second chip connection terminals by a flip chip bonding technique, a wire bonding technique, or a tape automated bonding technique.

15. The device of claim 13, wherein a plurality of second semiconductor chips are held above the second chip holding surface.

16. The device of claim 15, wherein the plurality of second semiconductor chips are held above the second chip holding surface as a stacked chip made by stacking the two second semiconductor chips so that the surfaces of the chips opposite to the surfaces where the second chip terminals are provided face each other, the second chip terminals of one of the two second semiconductor chips are electrically connected to the associated second chip connection terminals by a flip chip bonding technique, and the second chip terminals of the other of the two second semiconductor chips are electrically connected to the associated second chip connection terminals by a wire bonding technique or a tape automated bonding technique.

17. The device of claim 13, wherein the second substrate is made of glass epoxy resin, polyimide resin, aramid resin, or ceramic.

18. The device of claim 17, wherein the first and second substrates are made of the same material.

* * * * *